US012329016B2

(12) United States Patent
Seo et al.

(10) Patent No.: US 12,329,016 B2
(45) Date of Patent: Jun. 10, 2025

(54) ELECTRONIC DEVICE HAVING DISPLAY INCLUDING LIGHT SENSOR

(71) Applicant: Samsung Electronics Co., Ltd., Gyeonggi-do (KR)

(72) Inventors: Dongil Seo, Gyeonggi-do (KR); Jaehyoung Park, Gyeonggi-do (KR); Kihuk Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 429 days.

(21) Appl. No.: 17/862,736

(22) Filed: Jul. 12, 2022

(65) Prior Publication Data

US 2022/0392974 A1 Dec. 8, 2022

Related U.S. Application Data

(63) Continuation of application No. PCT/KR2022/007763, filed on May 31, 2022.

(30) Foreign Application Priority Data

Jun. 7, 2021 (KR) .................. 10-2021-0073670

(51) Int. Cl.
*H10K 59/60* (2023.01)
*H04M 1/02* (2006.01)
*H10K 59/65* (2023.01)

(52) U.S. Cl.
CPC .......... *H10K 59/65* (2023.02); *H04M 1/0264* (2013.01); *H10K 59/60* (2023.02)

(58) Field of Classification Search
CPC .............................. H10K 59/60; H10K 59/65
(Continued)

(56) References Cited

U.S. PATENT DOCUMENTS 10,511,821 B2 12/2019 Lee
10,726,715 B2 7/2020 Hwang et al.
(Continued)

FOREIGN PATENT DOCUMENTS

CN 111243534 6/2020
EP 3 373 563 9/2018
(Continued)

OTHER PUBLICATIONS

Taisuke Kamada et al., "OLED Display Incorporating Organic Photodiodes for Fingerprint Imaging", Journal of the Society for Information Display, Mar. 25, 2019, 11 pages.
(Continued)

*Primary Examiner* — Christopher M Raabe
(74) *Attorney, Agent, or Firm* — The Farrell Law Firm, P.C.

(57) ABSTRACT

An electronic device in various embodiments may include: a front cover forming a front surface of the electronic device; a rear cover forming a rear surface opposite to the front surface; a display placed between the front cover and the rear cover and visually exposed through the front cover; a first camera disposed on the front surface; and a processor operatively connected to the first camera and the display. The display may be divided into a display region and a sensor region when facing the front surface. The display may include: a light-emitting/light-receiving layer including light-emitting diodes disposed in the display region and at least one photodiode disposed in the sensor region; and a filter layer placed between the front cover and the light-emitting/light-receiving layer and including light-emitting filters aligned with the light-emitting diodes in the display region, and at least one light-receiving filter aligned with the at least one photodiode in the sensor region. The processor may be configured to receive, from the at least one photo-
(Continued)

diode, light information related to light passed through the at least one light-receiving filter to be received by the at least one photodiode, and perform, by the light information, a function related to an image acquired from the first camera to be displayed on the display.

16 Claims, 13 Drawing Sheets

(58) Field of Classification Search
USPC .......................................................... 257/618
See application file for complete search history.

(56) References Cited

U.S. PATENT DOCUMENTS

| | | | |
|---|---|---|---|
| 10,727,285 | B2 | 7/2020 | Chung et al. |
| 10,817,018 | B1 | 10/2020 | Shao et al. |
| 10,978,523 | B2 | 4/2021 | Park et al. |
| 2011/0205209 | A1 | 8/2011 | Kurokawa et al. |
| 2011/0279703 | A1 | 11/2011 | Lee |
| 2019/0333971 | A1 | 10/2019 | Kishimoto |
| 2019/0363792 | A1* | 11/2019 | Tsonev ................. H04B 10/11 |
| 2020/0111851 | A1 | 4/2020 | Park et al. |
| 2020/0286436 | A1 | 9/2020 | Lim |
| 2020/0286964 | A1 | 9/2020 | Cho |
| 2020/0342800 | A1 | 10/2020 | Li et al. |

FOREIGN PATENT DOCUMENTS

| | | | | |
|---|---|---|---|---|
| EP | 3 806 436 | | 4/2021 | |
| JP | 2021-508855 | | 3/2021 | |
| KR | 1020100044711 | | 4/2010 | |
| KR | 1020110067973 | | 6/2011 | |
| KR | 1020130009967 | | 1/2013 | |
| KR | 10-1678691 | | 11/2016 | |
| KR | 1020170103159 | | 9/2017 | |
| KR | 2019089605 A | * | 7/2019 | ........... G06F 3/0412 |
| KR | 1020190125558 | | 11/2019 | |
| KR | 1020200040196 | | 4/2020 | |
| KR | 1020200106580 | | 9/2020 | |
| KR | 1020210043887 | | 4/2021 | |
| WO | WO 2021/081017 | | 4/2021 | |

OTHER PUBLICATIONS

Chuan X. Xu et al., "Foldable AMOLED Display Utilizing Novel COE Structure", Book 1: Session 24: Flexible Barrier Materials, The Society for Information Display, http://olednet.com/category/focus-on/technology/, May 30, 2018, 4 pages.

International Search Report dated Sep. 7, 2022 issued in counterpart application No. PCT/KR2022/007763, 10 pages.

European Search Report dated Sep. 23, 2024 issued in counterpart application No. 22820468.1-1218, 10 pages.

Korean Office Action dated May 1, 2025 issued in counterpart application No. 10-2021-0073670, 12 pages.

* cited by examiner

ELECTRONIC DEVICE HAVING DISPLAY INCLUDING LIGHT SENSOR

CROSS-REFERENCE TO RELATED APPLICATIONS

This application is a Bypass Continuation Application of International Application No. PCT/KR2022/007763, which was filed on May 31, 2022, and is based on and claims priority under 35 U.S.C. § 119 to Korean Patent Application No. 10-2021-0073670, which was filed in the Korean Intellectual Property Office filed on Jun. 7, 2021, the entire disclosure of each of which is incorporated herein by reference.

BACKGROUND

1. Field

The disclosure relates generally to an electronic device having a display including a light sensor.

2. Description of Related Art

When a camera is used to capture an image of an object, the object in the image may have a distorted color, which is different from the proper color thereof, due to an external 20 light source (e.g., a fluorescent lamp, an incandescent lamp, the sun, etc.). To correct this type of distortion, automatic white balance (AWB) may be used to determine the picture quality. For example, an electronic device may include a sensor for acquiring light information (e.g., an ambient light sensor (ALS), a flicker sensor, an illuminance sensor, etc.). The electronic device may also use light information, such as brightness, wavelength, type of light-emitting light source, etc., to correct images obtained from the camera, thereby removing color distortion.

An electronic device may include a display that fills the entire front surface without a bezel. As result, a front camera and a light sensor may be disposed beneath the display, facing forwards. However, light information acquired by the light sensor may be distorted under the influence of the display. Consequently, the distortion by the display may adversely affect image correction.

SUMMARY

The disclosure has been made to address at least the above-mentioned problems and/or disadvantages and to provide at least the advantages described below.

An aspect of the disclosure is to provide an electronic device that may acquire accurate light information from a light sensor disposed on a display.

Another aspect of the disclosure is to provide an electronic device that may acquire accurate light information from a light sensor disposed on a display, and may use the acquired light information to perform a function related to an image to be displayed on the display, after being acquired from a camera.

In accordance with an aspect of the disclosure, an electronic device may include a front cover forming a front surface of the electronic device; a rear cover forming a rear surface opposite to the front surface; a display placed between the front cover and the rear cover and visually exposed through the front cover; a first camera disposed on the front surface; and a processor operatively connected to the first camera and the display. The display may be divided into a display region and a sensor region when facing the front surface. The display may include: a light-emitting/light-receiving layer including light-emitting diodes disposed in the display region, and at least one photodiode disposed in the sensor region; and a filter layer placed between the front cover and the light-emitting/light-receiving layer and including light-emitting filters aligned with the light-emitting diodes in the display region, and at least one light-receiving filter aligned with the at least one photodiode in the sensor region. The processor may be configured to receive, from the at least one photodiode, light information related to light passed through the at least one light-receiving filter to be received by the at least one photodiode, and perform, by using the light information, a function related to an image acquired from the first camera to be displayed on the display.

In accordance with another aspect of the disclosure, an electronic device may include: a front cover forming a front surface of the electronic device; a rear cover forming a rear surface opposite to the front surface; and a display placed between the front cover and the rear cover, visually exposed through the front cover, and divided into a display region and a sensor region for recognizing a light source, when facing the front surface. The display may include: a light-emitting/light-receiving layer including light-emitting diodes disposed in the display region, a first photodiode disposed in a first sub-sensor region of the sensor region, and a second photodiode disposed in a second sub-sensor region of the sensor region; and a filter layer placed between the front cover and the light-emitting/light-receiving layer and including light-emitting filters aligned with the light-emitting diodes in the display region, a first light-receiving filter aligned with the first photodiode in the first sub-sensor region, and a second light-receiving filter aligned with the second photodiode in the second sub-sensor region. The first light-receiving filter may filter out visible light and infrared light components from light received from the outside through the front cover. The second light-receiving filter may filter out a visible light component from light received from the outside through the front cover. The first photodiode may generate an electrical signal in response to visible light and infrared light components having passed through the first light-receiving filter. The second photodiode may generate an electrical signal in response to a visible light component having passed through the second light-receiving filter.

According to various embodiment, an electronic device may acquire accurate light information from a light sensor disposed on a display, and may use the acquired light information to perform a function related to an image to be displayed on the display after being acquired from a camera. Various other advantageous effects identified explicitly or implicitly through the disclosure may be provided.

BRIEF DESCRIPTION OF THE DRAWINGS

The above and other aspects, features, and advantages of the disclosure will be more apparent from the following detailed description taken in conjunction with the accompanying drawings, in which.

DETAILED DESCRIPTION

Figure 1:
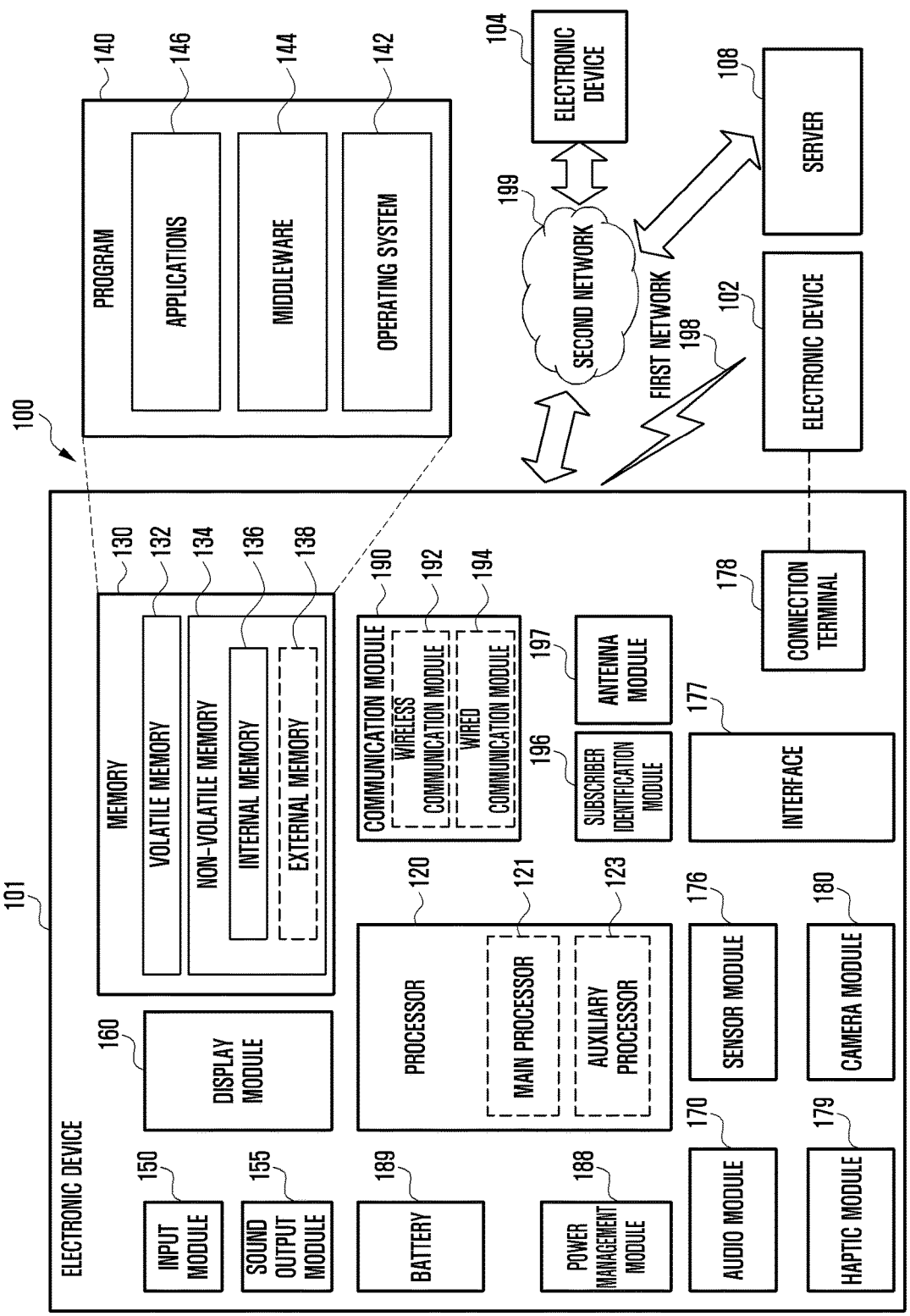
FIG. 1 is a block diagram of an electronic device in a network environment, according to various embodiments.

Hereinafter, various embodiments will be described in detail with reference to attached drawings. In the disclosure, embodiments are described in the drawings and a related detailed description is set forth, but this is not intended to limit the embodiments of the disclosure. Descriptions of well-known functions and constructions are omitted for the sake of clarity and conciseness.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate.

The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
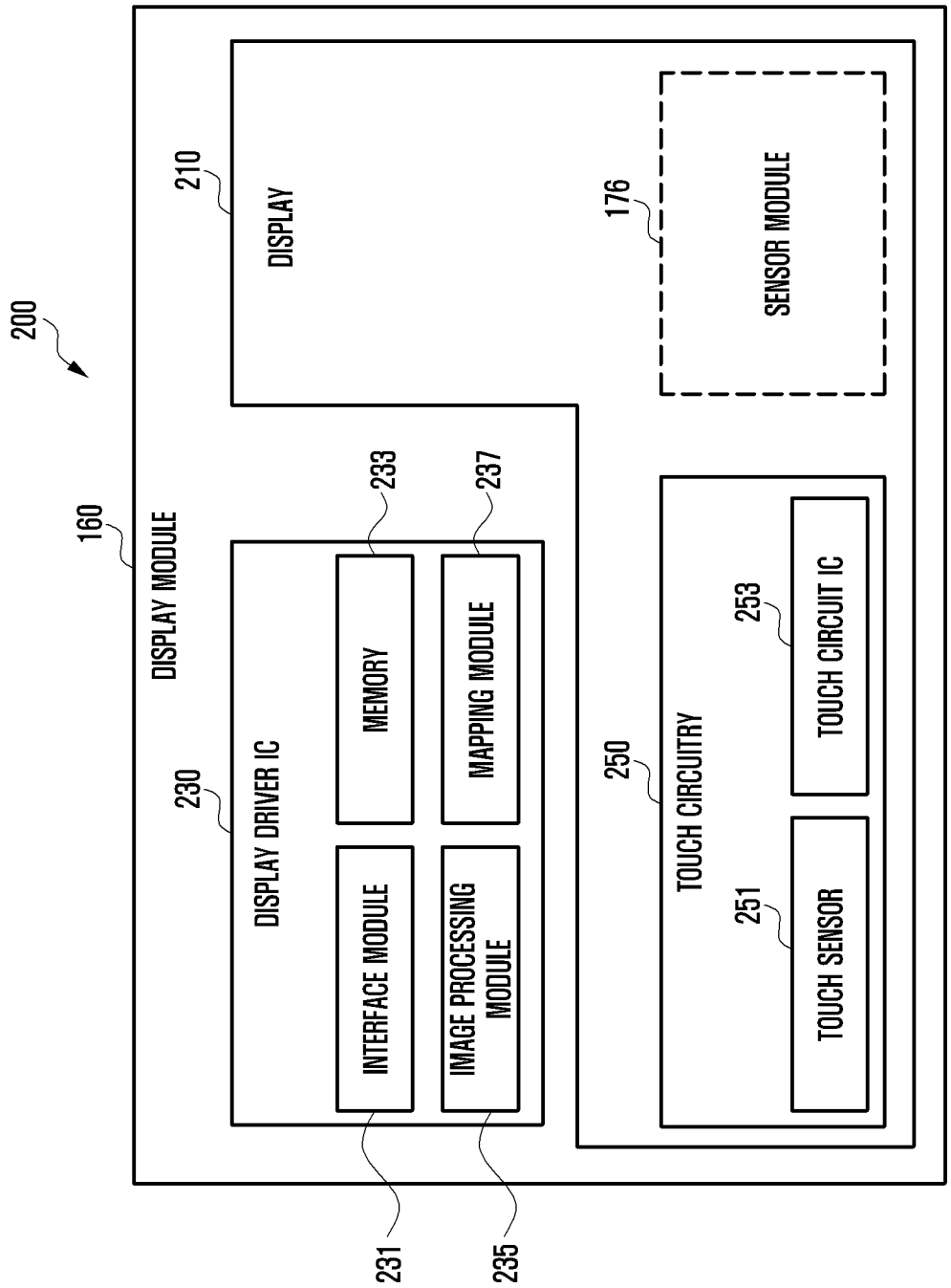
FIG. 2 is a block diagram of a display module according to various embodiments.

FIG. 2 is a block diagram 200 illustrating the display module 160 according to various embodiments.

Referring to FIG. 2, the display module 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis.

The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210.

The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display module 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image)

corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Various housing structures may be applied to the electronic device 101. For example, the electronic device 101 may have a bar-type housing structure. The bar-type housing structure may include a plate forming a front surface of the electronic device 101, a plate forming a rear surface of the electronic device 101, and a bezel structure forming a side surface surrounding the front and rear surfaces. A display may be disposed on the front surface. As another example, the electronic device 101 may have a foldable housing structure that is divided into two housings about a folding axis. A first display region of a display (e.g., a flexible display) may be disposed in the first housing, and a second display region of the display may be disposed in the second housing. The foldable housing structure may be implemented in an in-folding type in which the first display region and the second display region face each other when the electronic device 101 is in a folded state. Alternatively, the foldable housing structure may be implemented in an out-folding type in which the first display region and the second display region face in opposite directions to each other when the electronic device 101 is in a folded state. As another example, the electronic device 101 may have a slidable (or rollable) housing structure. For example, the electronic device 101 may include a slidable housing structure including a first housing and a second housing, a roller (or slider) for allowing a part of the second housing to be drawn into or drawn out from the first housing, and a flexible display. The display may be disposed in a space formed by the slidable housing structure. The display may include the first display region disposed adjacent to the first housing and the second display region disposed on the inner space while surrounding the roller. In an electronic device having a foldable housing structure or a slidable housing structure, a surface from which the flexible display is visually exposed may be defined as a front surface. The opposite surface of the front surface may be defined as a rear surface of the electronic device. In addition, a surface surrounding a space between the front surface and the rear surface may be defined as a side surface of the electronic device.

Figure 3A:
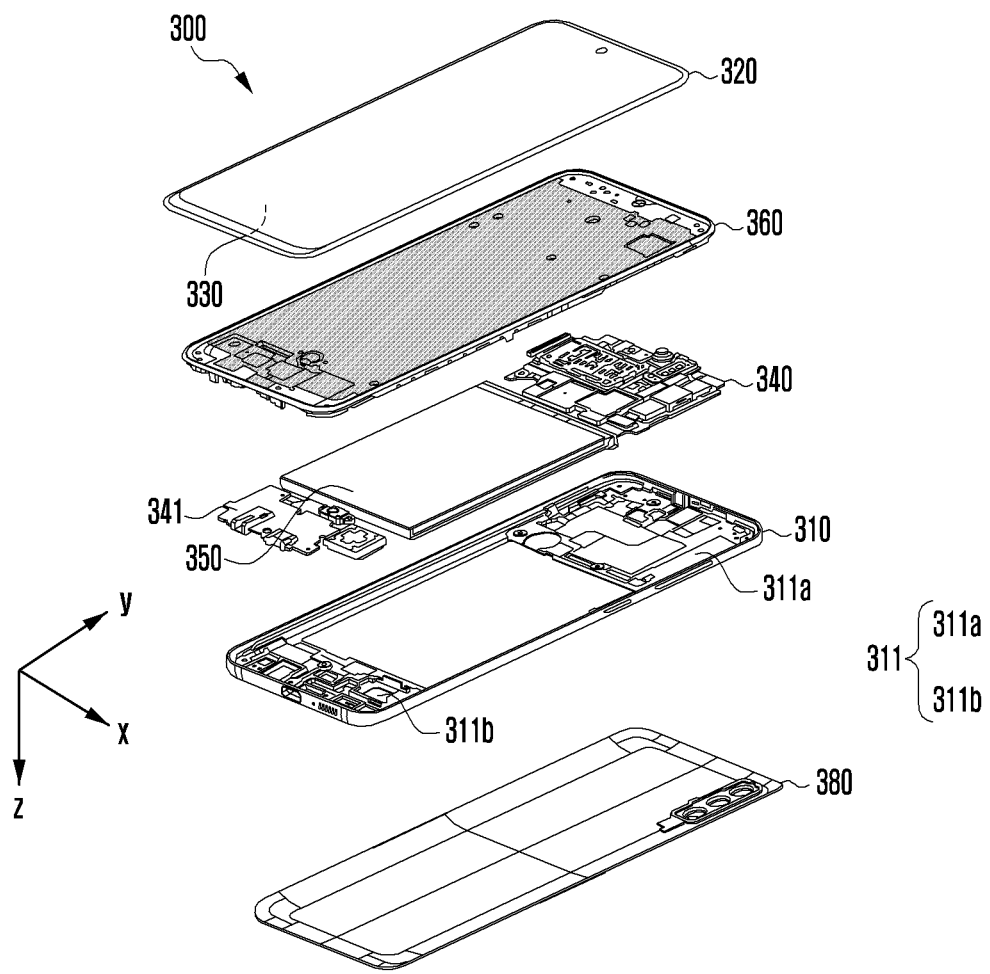
FIGS. 3A and 3B illustrate a position of a light sensor for acquiring light information in an electronic device, according to an embodiment.
Figure 3B:
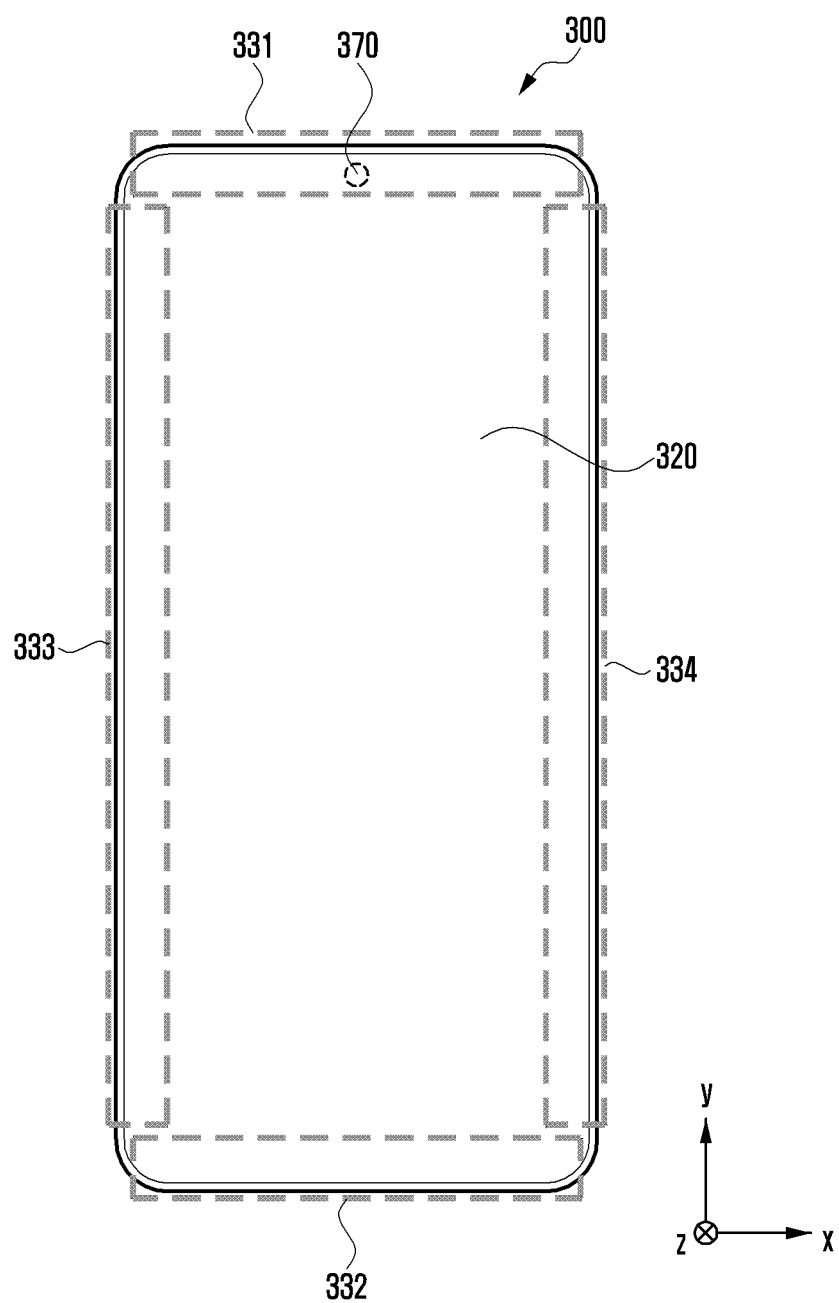

FIGS. 3A and 3B illustrate a position of a sensor for acquiring light information in the electronic device 300 (e.g., the electronic device 101 of FIG. 1) according to an exemplary embodiment.

Referring to FIGS. 3A and 3B, the electronic device 300 (e.g., the electronic device 101 of FIG. 1) may include a side bezel structure (or a side frame) 310, a first support member (or a first support frame) 311, a front plate (or a front cover) 320, a display 330 (e.g., the display module 160 of FIG. 1), at least one printed circuit board 340 and 341, a battery 350 (e.g., the battery 189 of FIG. 1), a second support member (or a second support frame) 360, and a rear plate (or a rear cover) 380. The front plate 320 may form a first surface (or a front surface) of the electronic device 300 facing in a first direction, the rear plate 380 may form a second surface (or a rear surface) of the electronic device 300 facing in a second direction opposite to the first direction, and the side bezel structure 310 may be configured by a combination of a metal (e.g., SUS) and a polymer and may form a side surface surrounding a space between the first surface and the second surface. According to an embodiment, a structure including the first surface, the second surface, and the side surface may be referred to as a housing (or a housing structure). In some embodiments, at least one of the elements (e.g., the first support member 311 or the second support member 360 of the electronic device 300 may be omitted or another element may be added to the electronic device 300.

The printed circuit boards 340 and 341 may be disposed to be supported by the first support member 311 and/or the second support member 360. The first support member 311 may be coupled to the side bezel structure 310. The first support member 311 may include a structure (e.g., a metal or a polymer) extending from the side bezel structure 310. The first support member 311 may be formed of, for example, a metal and/or a non-metal material (e.g., a polymer). The display 330 may be coupled to one surface of the second support member 360 and the printed circuit boards 340 and 341 may be coupled to the other surface thereof. The printed circuit boards 340 and 341 may be equipped with a processor 120, a memory 130, and/or an interface 177. According to an embodiment, the printed circuit boards 340 and 341 may include a main board 340 and a sub-board 341. The first support member 311 may include a main substrate support member 311a configured to support the main substrate 340, and a sub-substrate support member 311b configured to support the sub-substrate 341. The processor 120 may include, for example, one or more of a central processing unit, an application processor, a graphic processing unit, an image signal processor, a sensor hub processor, and a communication processor. The memory 130 may include, for example, a volatile memory or a non-volatile memory.

The battery 350 may be disposed to be supported by the first support member 311 and/or the second support member 360. The battery 350, which is a device for supplying power to at least one element of the electronic device 300, may include, for example, a non-rechargeable primary battery, a rechargeable secondary battery, or a fuel cell. At least a portion of the battery 350 may be disposed on, for example, substantially the same plane as the printed circuit boards 340 and 341.

The display 330 may include a light sensor configured by a combination of a filter and a photodiode. The filter may filter a specified light component within a wavelength band from light incident to the filter through the front cover (e.g., a coating layer, or ultra-thin glass (UTG)) 320. The photodiode paired with the filter may respond to a light component having passed through the filter. For example, the photodiode may generate an electrical signal (e.g., current) corresponding to a light component having passed through the filter. An analog to digital converter (ADC) (not shown) may convert an electrical signal generated by the photodiode into a digital signal and transmit the digital signal to the processor 120. For example, the digital signal may be stored in a buffer before being transmitted to the processor 120. The digital signal may be transmitted to the processor 120 through the buffer in a first in first out (FIFO) method in which data first input to the buffer is first output. For example, when the light intensity is strong, data having a large value may be output from the ADC to the processor 120 through the buffer. When the light intensity is relatively low, data having a small value may be output from the ADC to the processor 120 through the buffer.

The display 330 may include a light sensor (e.g., an ambient light sensor (ALS), and a flicker sensor) (hereinafter, referred to as a light source recognition sensor) for recognizing a light source type (e.g., a fluorescent lamp, an incandescent lamp, and sunlight) and/or a light sensor (hereinafter, an illuminance sensor) for measuring the illuminance around the electronic device 300. Intensity of infrared light (a light component having a wavelength band of about 700 to 1100 nm) may be different according to each light source type. For example, a fluorescent lamp may have weaker infrared light compared to sunlight. An incandescent lamp may have strong infrared light compared to sunlight. Accordingly, the light source recognition sensor may be configured by a combination of a photodiode and a filter capable of acquiring infrared intensity. The light source recognition sensor may include a combination of a filter (hereinafter, a broadband filter) which filters spectrum light (e.g., a light component having a wavelength band of about 300 to 1100 nm) including infrared light and visible light (a light component having a wavelength band of about 400 to 700 nm) and a photodiode which responds to light having passed through the broadband filter, and a combination of a visible light filter and a photodiode which responds to visible light. Alternatively, the light source recognition sensor may include a combination of an infrared filter and a photodiode which responds to infrared light. The human eye can respond most sensitively to G among R (red), G (green), and B (blue). Accordingly, the illuminance sensor may include a combination of a filter which filters green color-based light (about 450 to 650 nm) and a photodiode which responds to green. The processor 120 may correct an image by using data received from a light sensor (e.g., a light source recognition sensor and/or an illuminance sensor) through the ADC and display the corrected image on the display 330.

The display 330 may include a light sensor (hereinafter, a proximity sensor) configured to recognize an object which is close to the electronic device 300 and calculate a distance between the electronic device 300 and the object adjacent thereto. The proximity sensor may further include a light-emitting diode that generates light (e.g., infrared light and/or green light) in a wavelength band designated to pass through a filter. For example, when the light generated from the light-emitting diode of the proximity sensor passes through the filter of the proximity sensor and is reflected by the object to reach the photodiode of the proximity sensor through the filter, data indicating the proximity of the object may be transmitted the processor 120 to the photodiode of the proximity sensor through the ADC. The processor 120 may recognize the proximity of the object and calculate a distance between the object and the electronic device 300, based on the data transmitted from the proximity sensor through the ADC. For example, the processor 120 may calculate a value representing a distance between the object and the electronic device 300 by using a time difference between a time point at which light is emitted through the light-emitting diode and a time point at which the light is received through the photodiode.

Referring to FIG. 3B, a light sensor may be disposed in various places on the display 330. For example, when the front cover 320 is viewed from the front, the front camera 370 may be disposed under the upper end of the front cover 320. The light sensor may be disposed in a display upper region 331 of the display 330, which is placed under the upper end of the front cover 320, such that the same does not overlap the front camera 370. In addition to the display upper region 331, the light sensor may be disposed in a display lower region 332, a display left region 333, or a display right region 334.

Figure 4A:
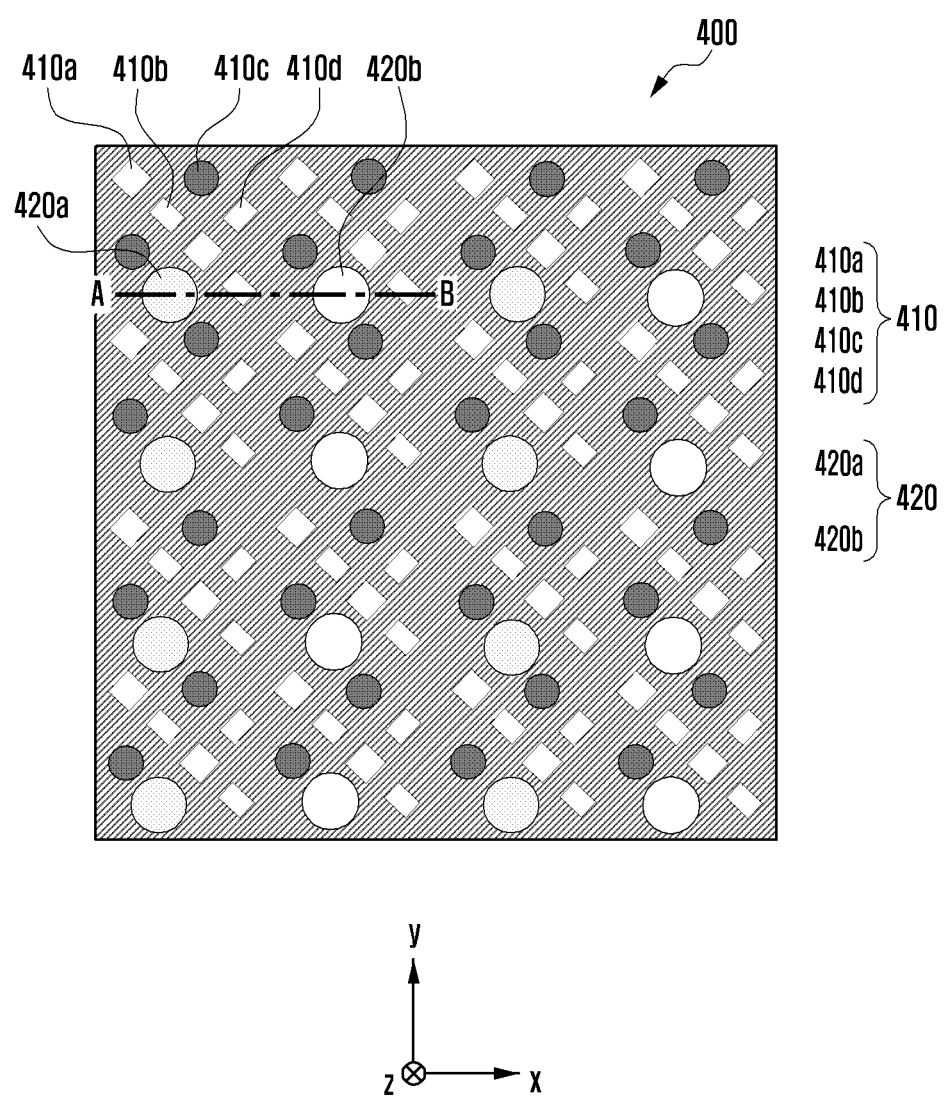
FIGS. 4A and 4B illustrate a display including a light source recognition sensor, according to an embodiment.
Figure 4B:
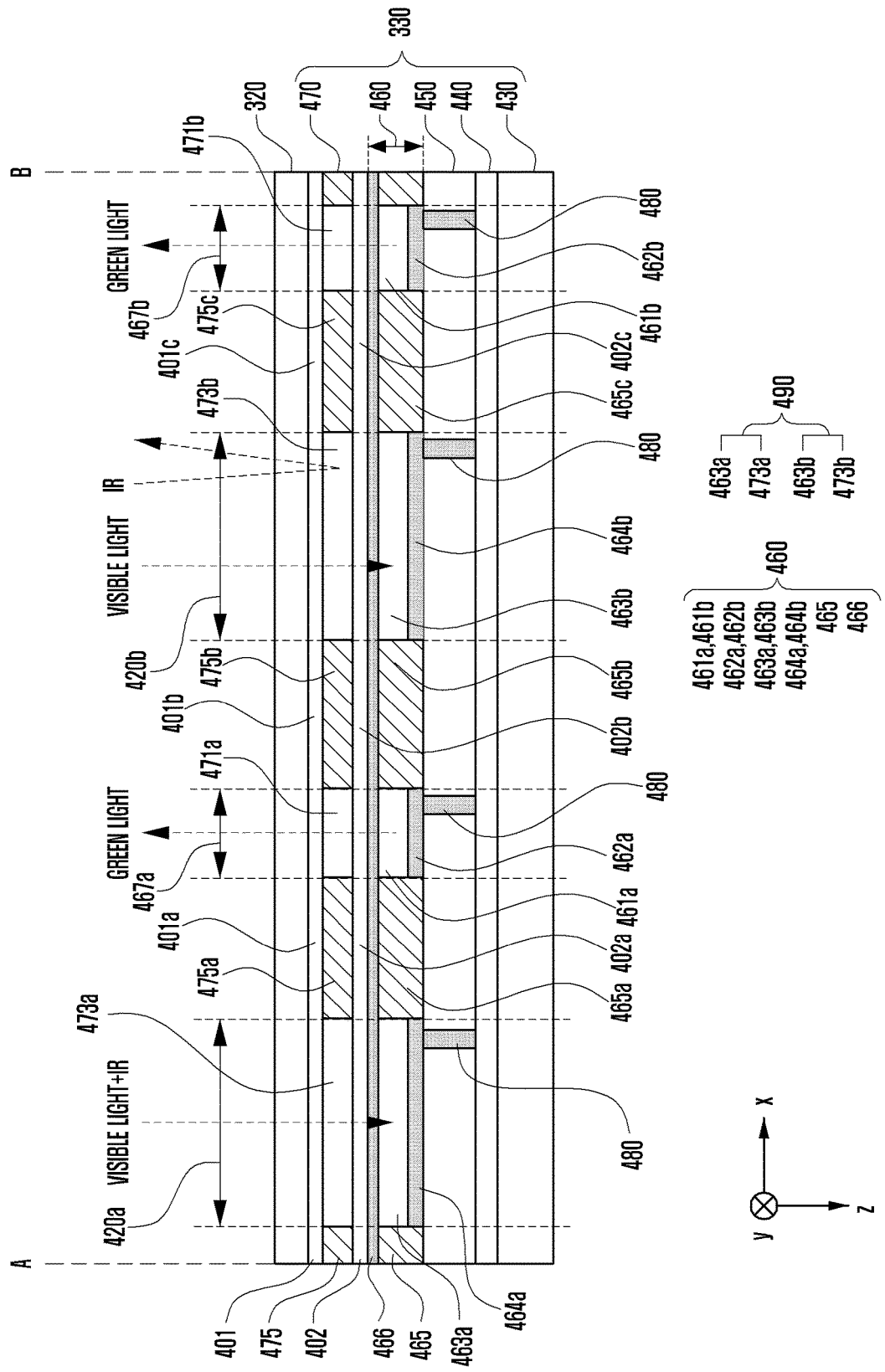

FIGS. 4A and 4B illustrate a display including a light source recognition sensor according to an embodiment. FIG. 4A illustrates a display region 400 including a light source recognition sensor in the display 330 of FIG. 3A, and FIG. 4B is a cross-sectional view taken along a portion AB in the z-axis direction in the display region 400 of FIG. 4A.

Referring to FIG. 4A, the display region 400 may include a plurality of pixel regions and at least one light source recognition sensor region when viewed in the z-axis direction. A combination of sub-pixel regions may be defined as one pixel region 410. For example, an RGBG pattern structure configured by a combination of an R (red) sub-pixel region 410a, a G (green) sub-pixel region 410b, a B (blue) sub-pixel region 410c, and a G (green) sub-pixel region 410d may be defined as one pixel region 410. In addition to the RGBG pixel structure as illustrated, another pixel structure (e.g., an RGB stripe structure and a diamond structure) may be defined as one pixel region. A plurality of sub-light source recognition sensor regions spaced apart from each other may be defined as one light source recognition sensor region 420. For example, a combination of a first sub-light source recognition sensor region 420a for receiving light in a wideband (e.g., about 300 to 1100 nm) and a second sub-light source recognition sensor region 420b for receiving visible light may be defined as one light source recognition sensor region 420. A remaining portion of the display region 400 other than the pixel region and the light source recognition sensor region may be formed of, for example, a thin film encapsulation (TFE).

Referring to FIG. 4B, the display 330 may be attached to the front cover 320 by using a first adhesive (e.g., a resin) 401. The display 330 may include an auxiliary layer 430, a substrate layer 440, a planarization layer 450, a light-emitting/light-receiving layer 460, and a filter layer 470.

The auxiliary layer 430 may be included in the display 330 as a means for reinforcing the rigidity of the display 330 (e.g., the substrate layer 440). For example, the auxiliary layer 430 may be made of at least one of polyethylene terephthalate (PET) and polyimide (PI).

The substrate layer 440 may be attached to the auxiliary layer 430. A driving circuit for driving the light-emitting diodes formed in the light-emitting/light-receiving layer 460 and a receiving circuit for receiving an electrical signal from the photodiodes formed in the light-emitting/light-receiving layer 460 may be formed on the substrate layer 440. For example, low-temperature polycrystalline silicon (LTPS) or low-temperature polycrystalline oxide (LTPO) may be used as a material of the substrate layer 440.

The planarization layer 450 may be formed on the substrate layer 440 such that an electrode is planarized on the light-emitting/light-receiving layer 460. For example, the planarization layer 450 may be formed on the substrate layer 440 by a spin coating process in which an organic material is applied and coated onto the substrate layer 440.

The light-emitting/light-receiving layer 460 may include light-emitting diodes 461a and 461b, light-emitting diode electrodes (or sub-pixel electrodes) 462a and 462b, a first photodiode 463a, a second photodiode 463b, a first photodiode electrode 464a, a second photodiode electrode 464b, a first insulation layer 465, and a common electrode 466.

The light-emitting diodes (e.g., active matrix organic light-emitting diodes (AMOLEDs) 461a and 461b) each as a sub-pixel may emit light having one color (e.g., G) from among R, G, and B. Light generated from the light-emitting diodes 461a and 461b may be output to the outside of the display through the sub-pixel regions 467a and 467b. Light-emitting diode electrodes (e.g., anodes) 462a and 462b may be formed on the planarization layer 450 through, for example, a deposition process. The light-emitting diodes 461a and 461b may be respectively formed on the light-emitting diode electrodes 462a and 462b through, for example, a deposition process.

The first photodiode 463a may receive light in a broad band (e.g., about 300 to 1100 nm) including visible light and infrared light through the first sub-light source recognition sensor region 420a. The first photodiode electrode 464a may be formed on the planarization layer 450 through, for example, a deposition process. The first photodiode 463a may be formed on the first photodiode electrode 464a through, for example, a deposition process. The first photodiode 463a may be implemented as an organic photodiode.

The second photodiode 463b may receive visible light through the second sub-light source recognition sensor region 420b. The second photodiode electrode 464b may be formed on the planarization layer 450 through, for example, a deposition process. The second photodiode 463b may be formed on the second photodiode electrode 464b through, for example, a deposition process. The second photodiode 463b may be implemented as an organic photodiode.

The electrodes 462a, 462b, 464a, 464b may be electrically connected to a circuit formed on the substrate 440 through conductive vias 480.

The diodes 461a, 461b, 463a, and 463b may be partitioned by a first insulation layer 465. A common electrode (e.g., a cathode) 466 may be formed on the diodes 461a, 461b, 463a, and 463b.

The filter layer 470 may be attached to the light-emitting/light-receiving layer 460 by using a second adhesive (e.g., a resin) 402. The filter layer 470 may include light filters (hereinafter, light-emitting filters) 471a and 471b that are paired with the light-emitting diodes 461a and 461b, respectively, and light filters (hereinafter, light-receiving filters) 473a and 473b that are paired with the photodiodes 463a and 463b, respectively.

The light filters 471a, 471b, 473a, and 473b may be partitioned by a second insulation layer 475. Each of the second insulation layer 475 may be referred to as a pixel define layer together with the first insulation layer 465. The insulation layers 465 and 475 may include a light blocking member (e.g., an organic material made of an opaque (e.g., black) material) for blocking light generated from the light-emitting diode from being incident onto the photodiode. For example, the light blocking member included in the first insulation layer 465 may include, a first insulation portion 465a placed between the first photodiode 463a and the first light-emitting diode 461a, a second insulation portion 465b placed between the first light-emitting diode 461a and the second photodiode 463b, and a third insulation portion 465c placed between the second photodiode 463b and the second light-emitting diode 461b. The light blocking member included in the second insulation layer 475 may be formed in a fourth insulation portion 475a placed between the first light-receiving filter 473a and the first light-emitting filter 471a, a fifth insulation portion 475b placed between the first light-emitting filter 471a and the second light-receiving filter 473b, and a sixth insulation portion 475c placed between the second light-receiving filter 473b and the second light-emitting filter 471b. Additionally, referring to FIG. 4B, in the adhesives 401 and 402, the light blocking member may also be formed in adhesive components 401a and 402a placed on the upper and the lower portion of the fourth insulation portion 475a, adhesive components 401b and 402b placed on the upper and the lower portion of the fifth insulation portion 475b, and/or adhesive components 401c and 402c placed on the upper and the lower portion of the sixth insulation portion 475c.

The light-emitting filters 471a and 471b may be aligned with the light-emitting diodes 461a and 461b, respectively, and filter light of a color generated from the light-emitting diodes 461a and 461b. For example, light-emitting diodes 461a and 461b disposed under the light-emitting filters 471a and 471b to be aligned therewith are G LEDs, and thus the light-emitting filters 471a and 471b may be G filters through which green color-based light passes.

The first light-receiving filter 473a may be aligned with the first photodiode 463a and filter light received from the first photodiode 463a. For example, the first light-receiving filter 473a may filter out visible light and IR components from light entering through the first sub-light source recognition sensor region 420a to output the visible light and IR components to the first photodiode 463a.

The second light-receiving filter 473b may be aligned with the second photodiode 463b and filter light received from the second photodiode 463b. For example, the second light-receiving filter 473a may reflect or absorb IR from light entering through the second sub-light source recognition sensor region 420b and filter out a visible light component to output the visible light component to the second photodiode 463b.

The first photodiode 463a and the first light-receiving filter 473a may be aligned with each other in the first sub-light source recognition sensor region 420a when viewed in the z-axis direction. Accordingly, the first light-receiving filter 473a may filter out visible light and IR components from light having entered the first sub-light source recognition sensor region 420a of the display 330 from the outside to output the visible light and IR components to the first photodiode 463a. The first photodiode 463a may convert the visible light and IR components into electrical signals corresponding thereto and output the signals to the processor through the ADC and the buffer.

The second photodiode 463b and the second light-receiving filter 473b may be aligned with each other in the second sub-light source recognition sensor region 420b when viewed in the z-axis direction. Accordingly, the second light-receiving filter 473b may filter out visible light from light having entered the second sub-light source recognition sensor region 420b of the display 330 from the outside and output the visible light to the second photodiode 463b. The second photodiode 463a may convert the visible light component into an electrical signal corresponding thereto and output the signal to the processor through the ADC and the buffer.

The light source recognition sensor 490 may be implemented by a combination of the first photodiode 463a and the first light-receiving filter 473a and a combination of the second photodiode 463b and the second light-receiving filter 473b. The light source recognition sensor 490 may be freely placed in various locations on the display 330.

Figure 5A:
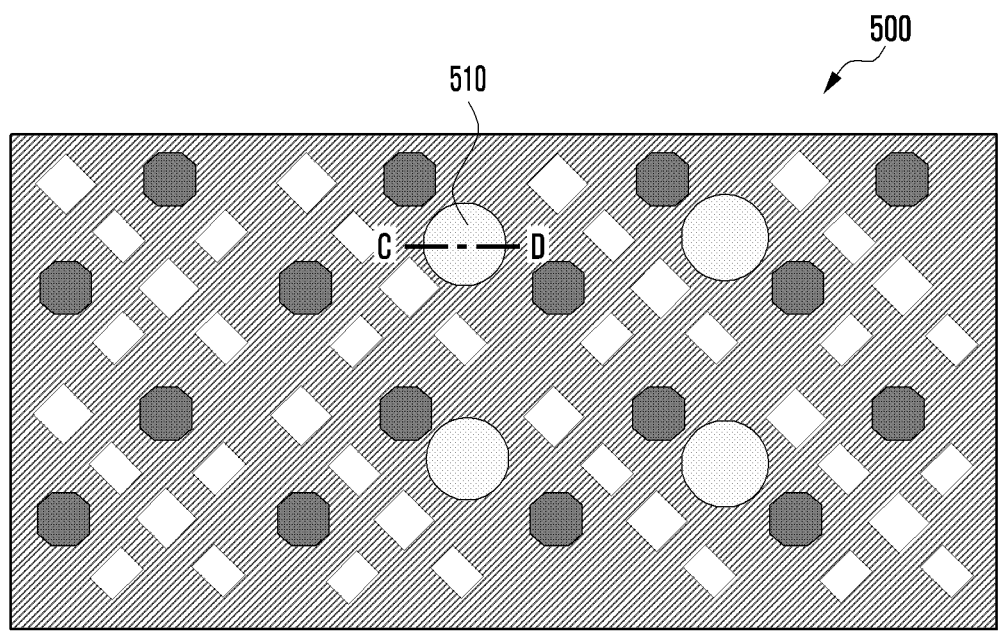
FIGS. 5A and 5B illustrate a display including an illuminance sensor, according to an embodiment.
Figure 5B:
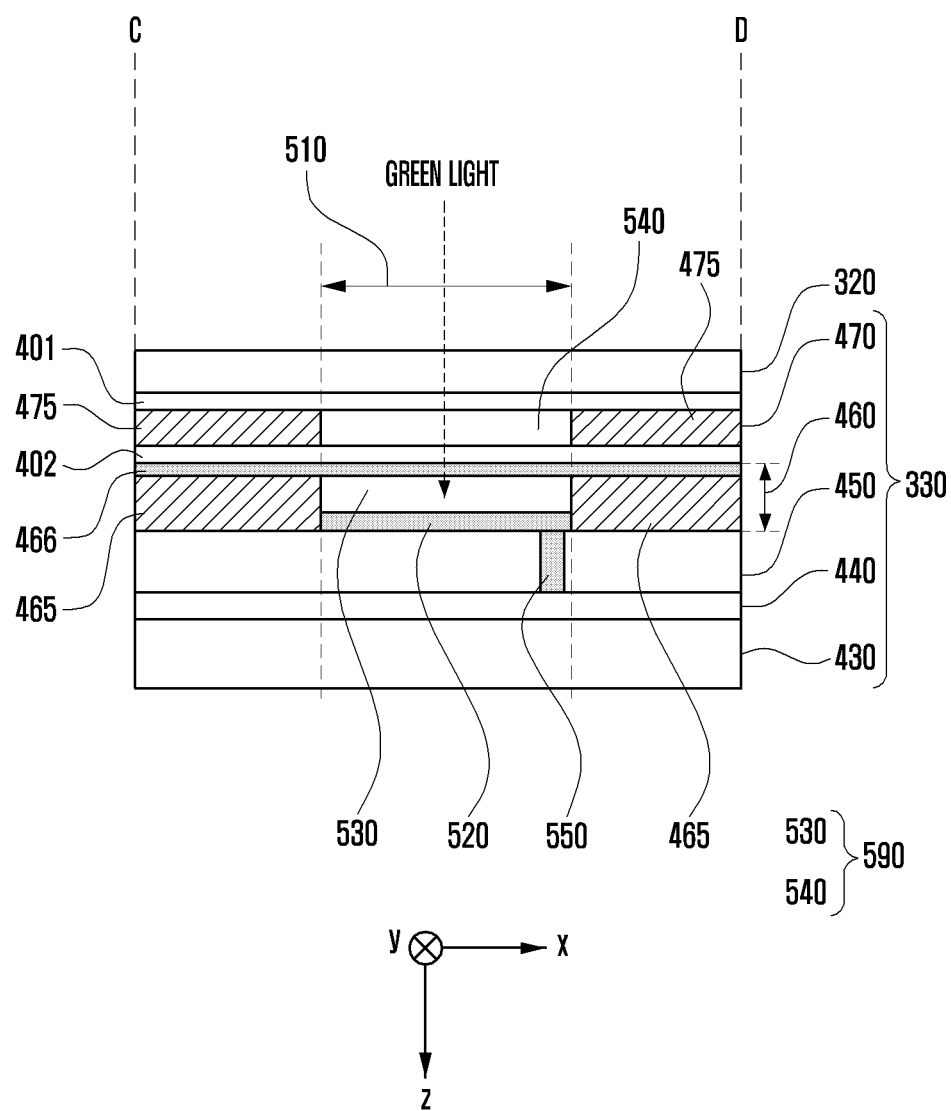

FIGS. 5A and 5B illustrate a display including an illuminance sensor, according to an embodiment. FIG. 5A illustrates a display region 500 including an illuminance sensor in the display 330 of FIG. 3A, and FIG. 5B is a cross-sectional view taken along a portion CD in the z-axis direction in the display region 500 of FIG. 5A. In describing FIGS. 5A and 5B, descriptions of an element and a structure overlapping those of FIGS. 4A and 4B will be omitted or briefly given.

Referring to FIG. 5A, the display region 500 may include a plurality of pixel regions and at least one illuminance sensor region when viewed in the z-axis direction. For example, the green color-based light may reach the photodiode placed inside the display 330 through an illuminance sensor region 510. The remaining portion of the display region 500 other than the pixel regions and the illuminance sensor region 510 may be formed of, for example, a thin film encapsulation (TFE).

Referring to FIG. 5B, the light-emitting/light-receiving layer 460 may include a third photodiode electrode 520 and a third photodiode 530 formed thereon. The filter layer 470 may include a third light-receiving filter 540.

The third photodiode 530 may receive green color-based light through the illuminance sensor region 510. The third photodiode electrode 520 may be formed on the planarization layer 450 through, for example, a deposition process. The third photodiode 530 may be formed on the third photodiode electrode 520 through, for example, a deposition process. The third photodiode 530 may be implemented as an organic photodiode. The third light-receiving filter 540 may be aligned with the third photodiode 530 and filter light received from the third photodiode 530. For example, the third light-receiving filter 540 may filter out a green component from light entering through the illuminance sensor region 510 and output the green component to the third photodiode 530.

The third photodiode electrode 520 may be electrically connected to a circuit formed on the substrate 440 through conductive vias 550.

The third photodiode 530 and the third light-receiving filter 540 may be aligned with each other in the illuminance sensor region 510 when viewed in the z-axis direction. Accordingly, the third light-receiving filter 540 may filter out a green component from light having entered the illuminance sensor region 510 of the display 330 from the outside and output the green component to the third photodiode 530. The third photodiode 530 may convert the green component into an electric signal corresponding thereto and output the signal to the processor through the ADC and the buffer.

The illuminance sensor 590 may be implemented by a combination of the third photodiode 530 and the third light-receiving filter 540. The illuminance sensor 590 may be freely placed in various locations on the display 330. For example, the illuminance sensor 590 may include a first illuminance sensor placed in the display upper region 331, a second illuminance sensor placed in the display lower region 332, a third illuminance sensor placed in the display left region 333, and a fourth illuminance sensor placed in the display right region 334. The processor (e.g., the processor 120 of FIG. 1) may calculate a first illuminance value by using light information received from the first illuminance sensor, calculate a second illuminance value by using light information received from the second illuminance sensor, calculate a third illuminance value by using light information received from the third illuminance sensor, and calculate a fourth illuminance value by using light information received from the fourth illuminance sensor. The processor may determine a largest value or an average value (e.g., an average among others excluding the smallest value) among the illuminance values as a representative value representing the ambient illuminance. The processor may set brightness of the display 330 by using the representative value. For example, the processor may set a screen of the display 330 to be dark in a dark environment (e.g., an environment in which illumination is about 50 Lux or less) and set the screen to be bright in a relatively bright environment. Accordingly, an error in which, when a portion of the front cover 320 is covered by an external object, a bright environment is misrecognized as a dark environment and thus the display 330 is set to have low brightness may be prevented.

Figure 6A:
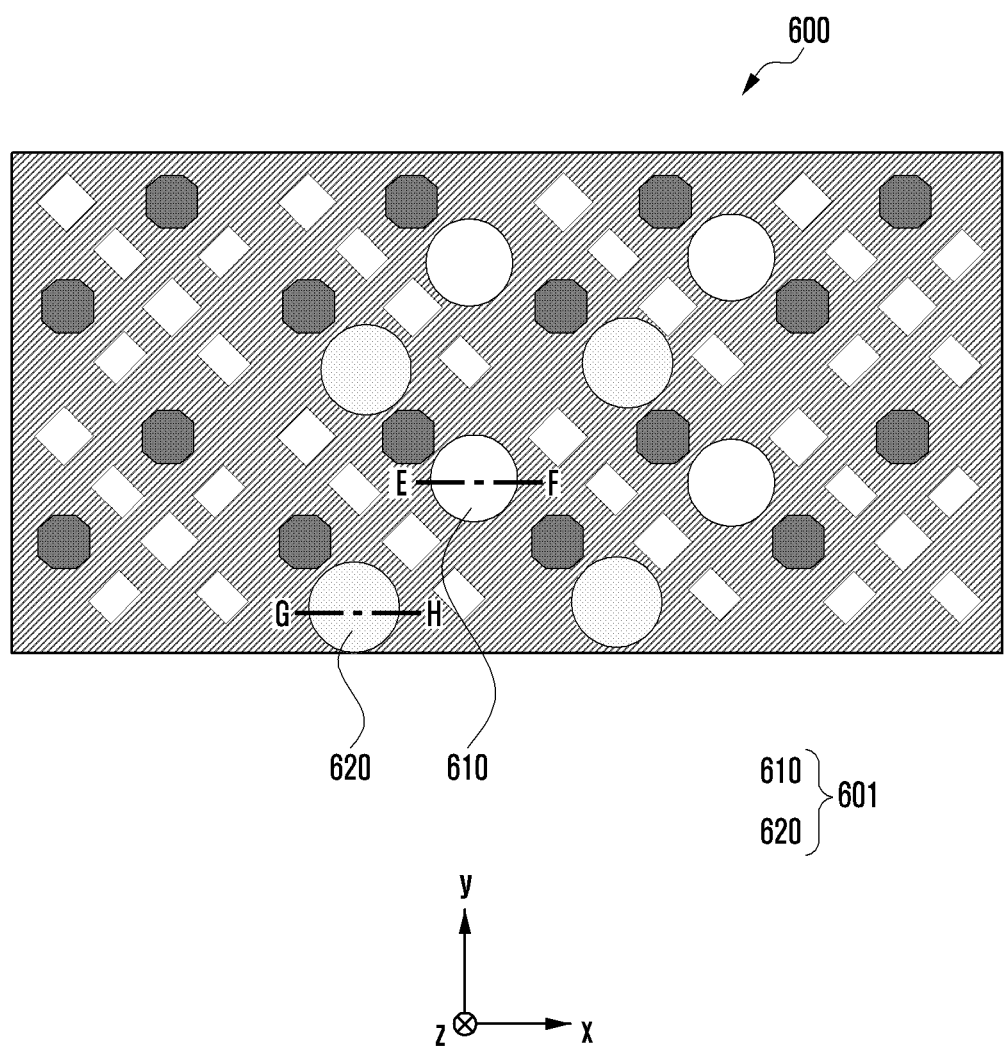
FIGS. 6A, 6B, and 6C illustrate a display including a proximity sensor, according to an embodiment.
Figure 6B:
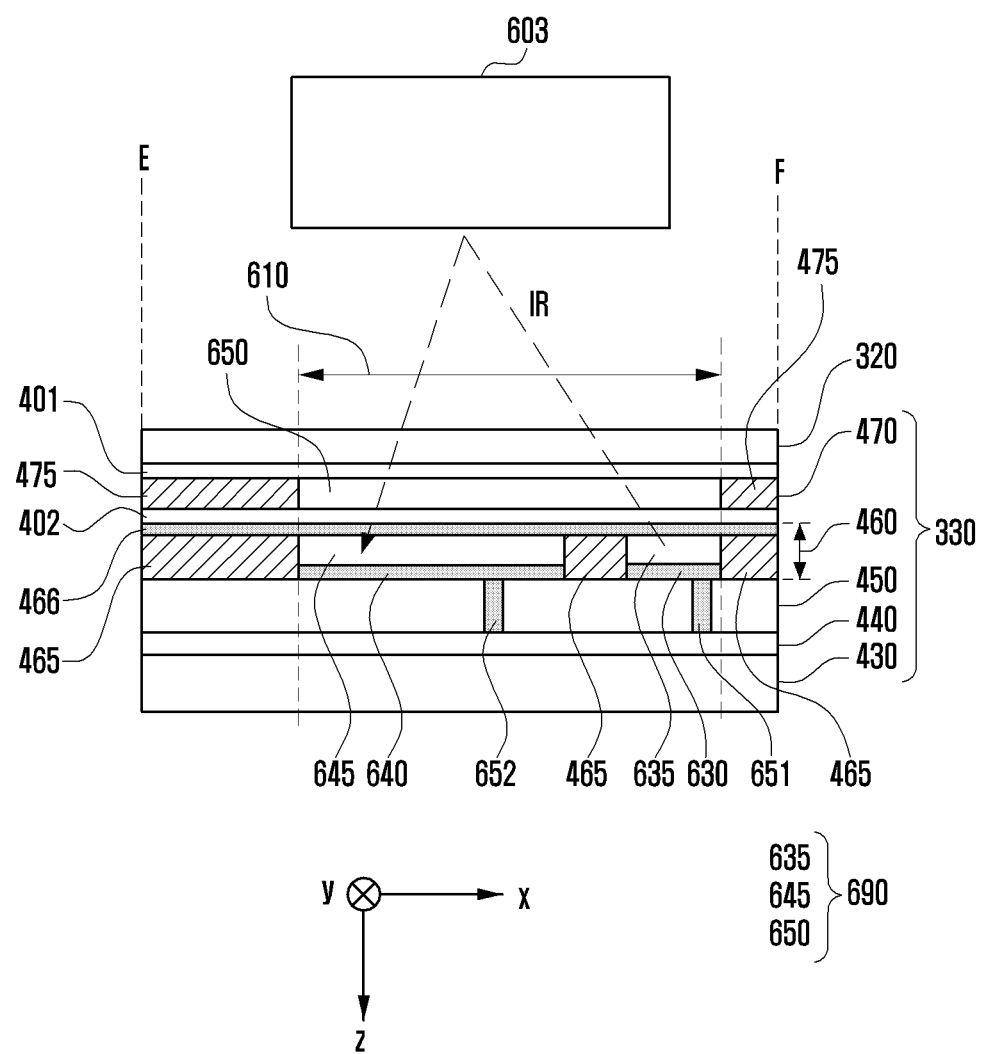
Figure 6C:
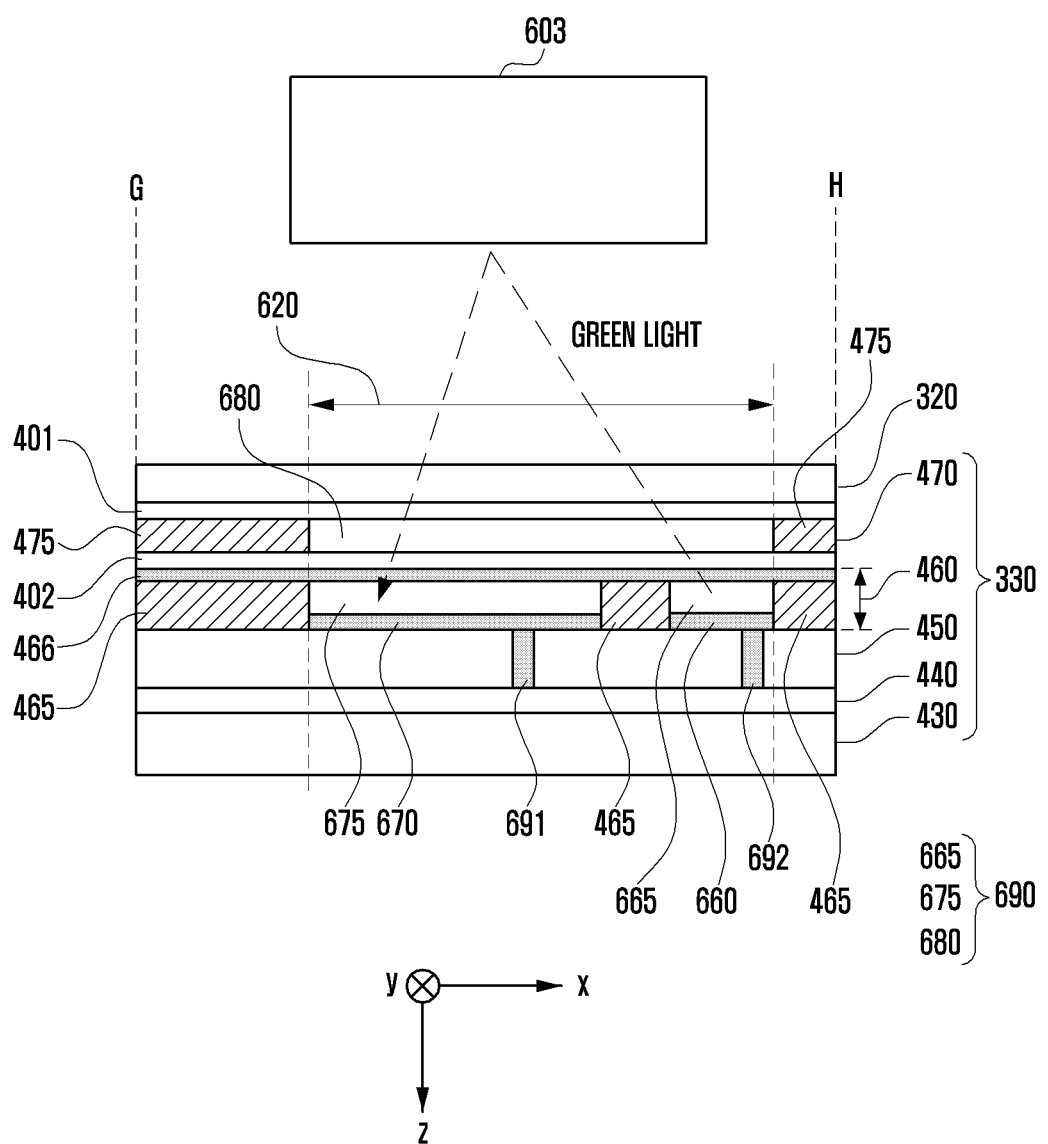

FIGS. 6A, 6B, and 6C illustrate a display including a proximity sensor, according to an embodiment. FIG. 6A is a display region 600 including a proximity sensor in the display 330 of FIG. 3A, and FIG. 6B is a cross-sectional view taken along a portion EF in the z-axis direction in the display region 600 of FIG. 6A. FIG. 6C is a cross-sectional view taken along a portion GH in the z-axis direction in the display region 600 of FIG. 6A. In describing FIGS. 6A, 6B, and 6C, descriptions of an element and a structure overlapping those of FIGS. 4A and 4B may be omitted or briefly given.

Referring to FIG. 6A, the display region 600 may include a plurality of pixel regions and at least one proximity sensor region 610 and 620 when viewed in the z-axis direction. In an embodiment, a plurality of sub-proximity sensor regions 610 and 620 spaced apart from each other may be defined as one proximity sensor region 601. For example, a combination of a first sub-proximity sensor region 610 for outputting and receiving infrared light and a second sub-proximity sensor region 620 for outputting and receiving green light may be defined as one proximity sensor region 601. The remaining portion of the display region 600 other than the pixel region and the proximity sensor region 601 may be formed of, for example, a thin film encapsulation (TFE).

Referring to FIG. 6B, the light-emitting/light-receiving layer 460 may include a first light-emitting diode electrode 630, a first light-emitting diode 635 formed thereon, a fourth photodiode electrode 640, and a fourth photodiode 645 formed thereon. The first light-emitting diode 635 may output IR and the fourth photodiode 645 may receive IR. The first light-emitting diode 635 may be implemented as an AMOLED, and the fourth photodiode 645 may be implemented as an organic photodiode. The filter layer 470 may include a light filter (hereinafter, referred to as a first light-emitting/light receiving filter) 650 that is aligned with the first sub-proximity sensor region 610 when viewed in the z-axis direction. The first light-emitting/light-receiving filter 650 may filter out IR from light reached the first light-emitting/light-receiving filter 650 to output the IR. For example, the first light-emitting diode 635 may generate IR under the control of the processor. The IR output from the first light-emitting diode 635 may be output to the outside through the first light-emitting/light-receiving filter 650. The IR emitted to the outside may be reflected from an external object 603 to enter the first light-emitting/light-receiving filter 650. IR may be output to the fourth photodiode 645 through the first light-emitting/light-receiving filter 650. The fourth photodiode 645 may convert the IR into an electric signal corresponding thereto and output the signal to the processor through the ADC and the buffer.

A first light-emitting diode 635 and a fourth photodiode 645 may be formed in the first light-emitting filter 650 when viewed in the z-axis direction such that IR output from the first light-emitting diode 635 can go out through the first light-emitting/light-receiving filter 650 and the IR entered the first sub-proximity sensor region 610 can reach the fourth photodiode 645 through the first light-emitting/light-receiving filter 650 when viewed in the z-axis direction.

The electrodes 630 and 640 may be electrically connected to a circuit formed on the substrate 440 through conductive vias 651 and 652.

Referring to FIG. 6C, the light-emitting/light-receiving layer 460 may include a second light-emitting diode electrode 660, a second light-emitting diode 665 formed thereon, a fifth photodiode electrode 670, and a fifth photodiode 675 formed thereon. The second light-emitting diode 665 may output green light, and the fifth photodiode 675 may receive green light. The second light-emitting diode 665 may be implemented as an AMOLED, and the fifth photodiode 675 may be implemented as an organic photodiode. The filter layer 470 may include a light filter (hereinafter, referred to as a second light-emitting/light-receiving filter) 680 that is aligned with the second sub-proximity sensor region 620 when viewed in the z-axis direction. The second light-emitting/light-receiving filter 680 may filter out green light from light reached the second light-emitting/light-receiving filter 680 to output the green light. For example, the second light-emitting diode 665 may generate green light under the control of the processor. The green light output from the second light-emitting diode 665 may be output to the outside through the second light-emitting/light-receiving filter 680. The green light emitted to the outside may be reflected by the external object 603 to reach the second light-emitting/light-receiving filter 680. The green light may be output to the fifth photodiode 675 through the second light-emitting/light-receiving filter 680. The fifth photodiode 675 may convert the green light into an electric signal corresponding thereto and output the signal to the processor through the ADC and the buffer.

The second light-emitting diode 665 and the fifth photodiode 675 may be formed in the second light-emitting/light-receiving filter 680 when viewed in the z-axis direction such that green light output from the second light-emitting diode 665 can go out through the second light-emitting/light-receiving filter 680 and the green light entered the second sub-proximity sensor region 620 can reach the fifth photodiode 675 through the second light-emitting/light-receiving filter 680 when viewed in the z-axis direction.

The electrodes 660 and 670 may be electrically connected to a circuit formed on the substrate 440 through conductive vias 691 and 692.

A proximity sensor 690 may be implemented by a combination of the first light-emitting diode 635, the fourth photodiode 645, and the first light-emitting/light-receiving filter 650 and a combination of the second light-emitting diode 665, the fifth photodiode 675, and the second light-emitting/light-receiving filter 680. The proximity sensor 690 may be freely placed in various locations on the display 330. For example, the proximity sensor 690 may include a first proximity sensor placed on the left side, a second proximity sensor placed at the center, and a third proximity sensor placed on the right side, with respect to the display upper region 331. The processor (e.g., the processor 120 of FIG. 1) may calculate a first distance value by using a time difference between a time point at which light is emitted through the first proximity sensor and a time point at which the light is received through the same, calculate a second distance value by using time difference between a time point at which light is emitted through the second proximity sensor and a time point at which the light is received through the same, and calculate a third distance value by using a time difference between a time point at which light is emitted through the third proximity sensor and a time point at which the light is received through the same. The processor may determine the distance to an external object by using the calculated distance values. For example, the processor may determine a median value or an average value among distance values as a representative value representing a distance to an external object. The proximity sensor 690 may be disposed in a display region event other than the display upper region 331. Accordingly, the processor may identify, through the proximity sensor 690, a portion of the display 330 to which the object is proximate.

Figure 7:
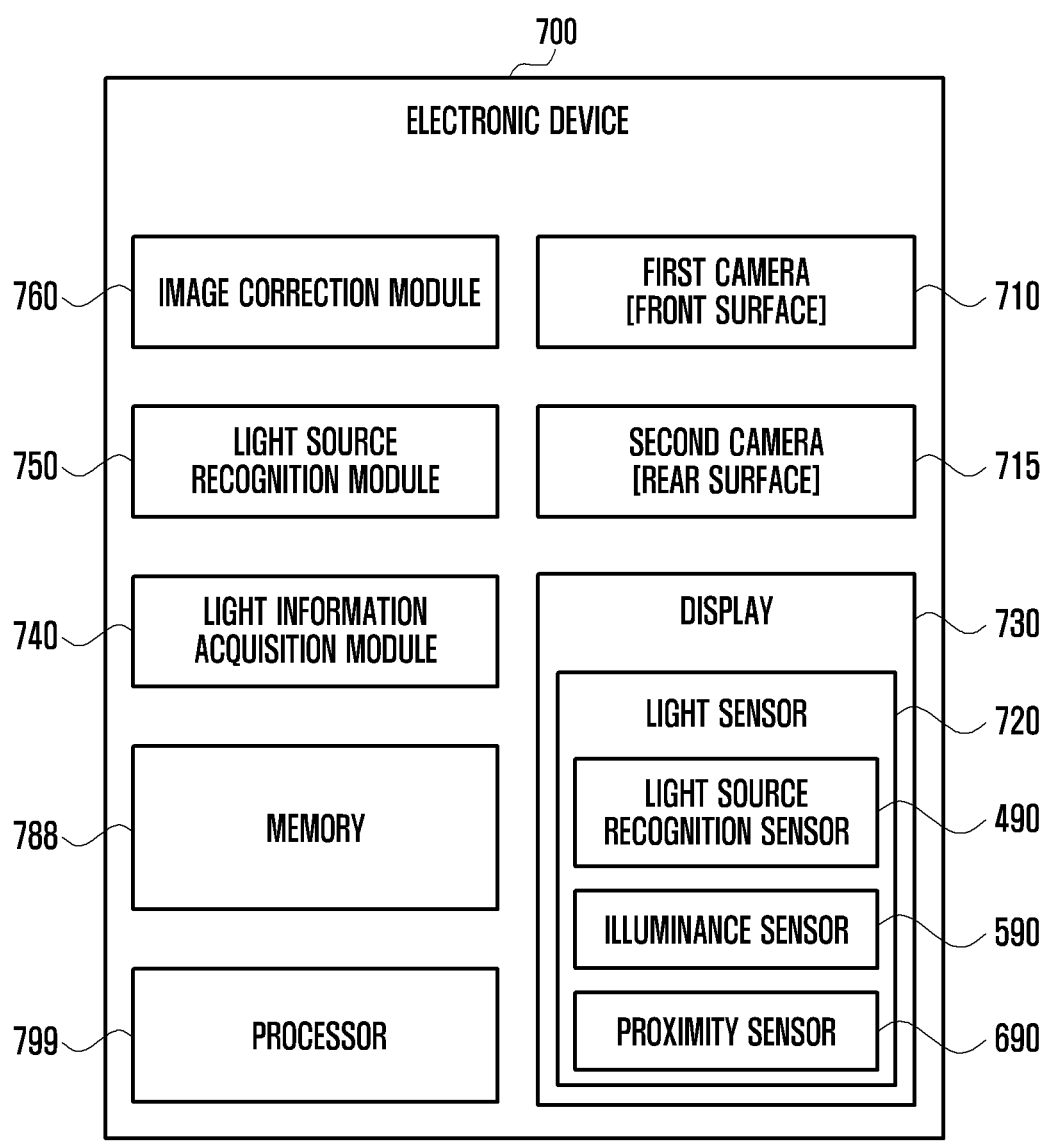
FIG. 7 is a block diagram of an electronic device according to various embodiments.
Figure 8:
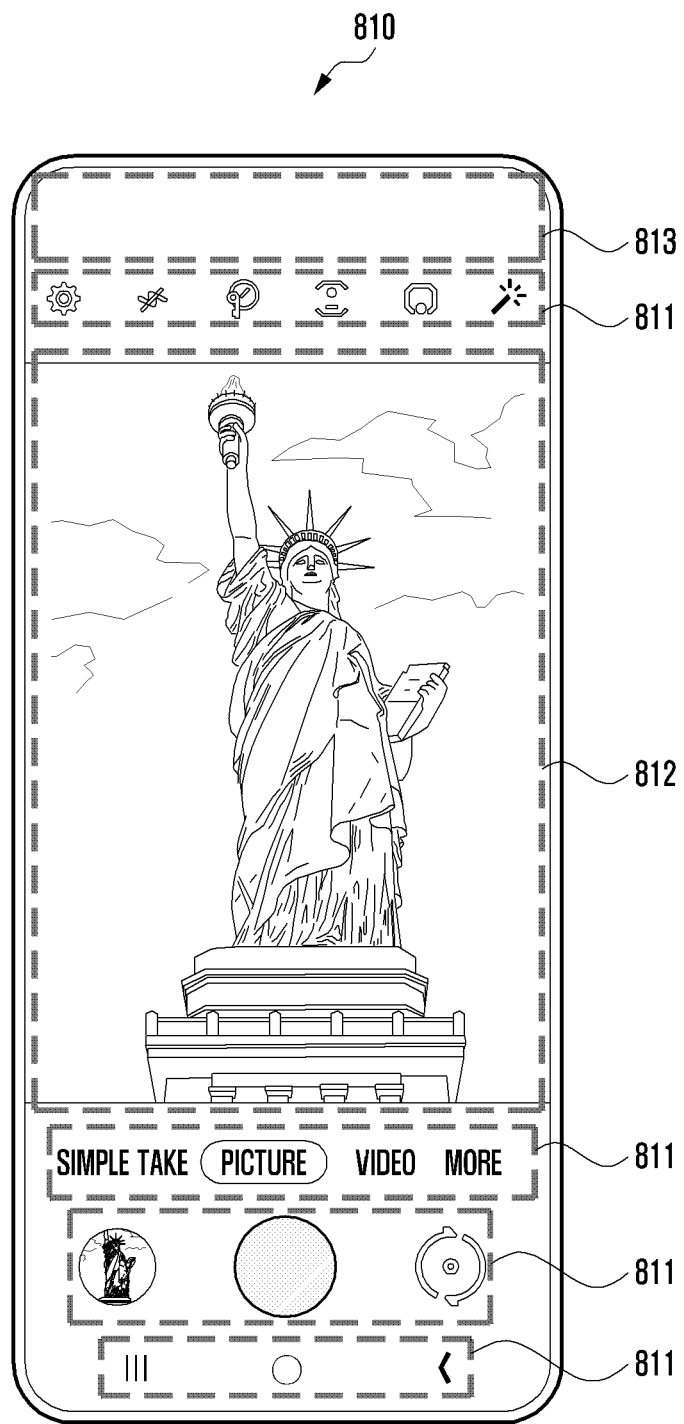
FIG. 8 illustrates an execution screen of a camera application displayed on the electronic device of FIG. 7.

FIG. 7 is a block diagram of an electronic device 700 according to various embodiments. FIG. 8 illustrates an execution screen of a camera application displayed on the electronic device 700 of FIG. 7.

Referring to FIG. 7, an electronic device (e.g., the electronic device 300 of FIGS. 3A and 3B) 700 may include a first camera 710, a second camera 715, a light sensor 720, a display 730, a light information acquisition module 740, a light source recognition module 750, an image correction module 760, a memory 788, and a processor 799 (e.g., the processor 120 of FIG. 1). The first camera 710 may be disposed on the front surface of the electronic device 700 together with the display 730. The second camera 715 may be disposed on the rear surface of the electronic device 700. The light sensor 720 may be structurally included in the display 730. The light sensor 720 may include the light source recognition sensor 490 of FIG. 4B, the illuminance sensor 590 of FIG. 5B, or the proximity sensor 690 of FIGS. 6B and 6C. The elements of the electronic device 700 may be operatively or electrically connected to each other.

When light information around the electronic device 700 is collected through the light sensor 720 in a state in which pixels (light-emitting diodes) around the light sensor 720 emit light, the collected light information may be distorted due to light emission of surrounding pixels. To prevent such distortion, the light information acquisition module 740 may be configured to acquire light information from the light sensor 720 while pixels around the light sensor 720 do not emit light.

The light information acquisition module 740 may activate the light sensor 720 at a time when the display 730 is momentarily darkened before the screen to be displayed on the display 730 is switched to the execution screen of the camera application, thereby acquiring light information around the electronic device 700 that is free from the influence of the display 730 from the light sensor 720.

For example, the processor 799 may recognize a user's touch input to an icon representing a camera application on the home screen displayed on the display 730 and execute the camera application (e.g., the application 146 of FIG. 1) according to the touch input. The processor 799 may display a first image acquired through the first camera 710 according to the execution of the camera application on the display 730 such that the same is included on the execution screen of the camera application. The light information acquisition module 740 may observe the execution state of the camera application and recognize the time point at which the display 730 becomes dark before the screen to be displayed on the display 730 is switched to the execution screen of the camera application, based on the observation result. The light information acquisition module 740 may activate the light sensor 720 at the recognized screen switching time point to acquire light information around the electronic device 700 from the light sensor 720.

As another example, in response to a user input (e.g., a touch input to a camera switching button included in the execution screen) while a second image acquired through the second camera 715 is displayed on the display 730, the processor 799 may display the first image acquired through the first camera 710 on the display 730 such that the same is included on the execution screen. As a result of observing the execution state of the camera application, the light information acquisition module 740 may recognize a time point at which the display 730 becomes dark before the second image is switched to the first image. The light information acquisition module 740 may activate the light sensor 720 at the recognized image switching time point to acquire light information around the electronic device 700 from the light sensor 720.

Referring to FIG. 8, the processor (e.g., the processor 799 of FIG. 7) may display, on the display (e.g., the display 730 of FIG. 7), an execution screen 810 of the camera application configured by a portion 811 configured to interact with a user and a portion 812 configured to display an image acquired through the camera. The processor 799 may control the display 730 such that the remaining regions other than the portions 811 and 812 are configured to be dark. The light sensor 720 (e.g., the light source recognition sensor 490) may be placed on the dark portions, for example, an upper portion (e.g., the display upper region 331 of FIG. 3B) 813. Accordingly, the light information acquisition module 740 may also be configured to acquire light information from the light sensor 720 while the execution screen 810 of the camera application is displayed.

The light source recognition module (e.g., the light source recognition module 750 of FIG. 7) may recognize a light source type illuminating the display 730 by using the light information received from the light source recognition sensor 490. For example, the light source recognition module 750 may calculate a first intensity value representing the intensity of light in a broad band from the light information acquired from the first photodiode 463a of the light source recognition sensor 490. The light source recognition module 750 may calculate a second intensity value representing the intensity of visible light from the light information acquired from the second photodiode 463b of the light source recognition sensor 490. The light source recognition module 750 may determine whether the light source is an artificial light source or sunlight by using the two intensity values. For example, the light source recognition module 750 may identify a light source type by using a value obtained by dividing a difference between the two intensity values by the second intensity value.

The image correction module (e.g., the image correction module 760 of FIG. 7) may correct an image acquired from the first camera 710, based on the identified light source type, such that the image has no color distortion. For example, the image correction module 760 may determine whether the electronic device 700 is located indoors or outdoors, based on the identified light source type. When it is determined that the electronic device is located outdoors, the image correction module 760 may perform AWB for removing color twists (e.g., color distortion) caused by sunlight from the image.

At least one of modules 740, 750, and 760 may be stored as instructions in memory 788 (e.g., the memory 130 of FIG. 1) and may be executed by the processor 799 (e.g., the processor 120 of FIG. 1). At least one of the modules 740, 750, and 760 may be executed by a processor (e.g., the auxiliary processor 123) specialized for an image processing process.

In accordance with an embodiment, an electronic device (e.g., the electronic device 300 of FIGS. 3A and 3B) may include: a front cover forming a front surface of the electronic device; a rear cover forming a rear surface opposite to the front surface; a display placed between the front cover and the rear cover and visually exposed through the front cover; a first camera disposed on the front surface; and a processor operatively connected to the first camera and the display. The display (e.g., the display 330 of FIG. 3A) may be divided into a display region and a sensor region when facing the front surface. The display may include: a light-emitting/light-receiving layer including light-emitting diodes disposed in the display region and at least one photodiode disposed in the sensor region; and a filter layer placed between the front cover and the light-emitting/light-receiving layer and including light-emitting filters aligned with the light-emitting diodes in the display region, and at least one light-receiving filter aligned with the at least one photodiode in the sensor region. The processor (e.g., the processor 799 of FIG. 7) may be configured to receive, from the at least one photodiode, light information related to light passed through the at least one light-receiving filter to be received by the at least one photodiode, and perform, by using the light information, a function related to an image acquired from the first camera to be displayed on the display.

The sensor region may include a first sensor region (e.g., the light source recognition sensor region 420 of FIG. 4A) configured to recognize a light source type. The at least one light-receiving filter may include: a first light-receiving filter (e.g., the first light-receiving filter 473a of FIG. 4B) disposed in the first sensor region and configured to filter out visible light and infrared light components from light received from the outside through the front cover; and a second light-receiving filter (e.g., the second light-receiving filter 473b of FIG. 4B) disposed in the first sensor region and configured to filter out a visible light component from light received from the outside through the front cover. The at least one photodiode may include: a first photodiode (e.g., the first photodiode 463a of FIG. 4B) aligned with the first light-receiving filter in the first sensor region and configured to respond to light having passed through the first light-receiving filter; and a second photodiode (e.g., the second photodiode 463b of FIG. 4B) aligned with the second light-receiving filter in the first sensor region and configured to respond to light having passed through the second light-receiving filter.

The processor may be configured to acquire information related to a light source type by using light information collected from the first photodiode and the second photodiode, and correct a first image acquired from the first camera, based on the acquired information, to display the corrected first image on the display.

The sensor region may include a second sensor region (e.g., the illuminance sensor region 510 of FIGS. 5A and 5B) for measuring the illuminance around the electronic device. The at least one light-receiving filter may include a third light-receiving filter (e.g., the third light-receiving filter 540 of FIG. 5B) disposed in the second sensor region and configured to filter out a specified color component from light received from the outside through the front cover. The at least one photodiode may include a third photodiode (e.g., the third photodiode 530 of FIG. 5B) aligned with the third light-receiving filter in the second sensor region and configured to respond to light having passed through the third light-receiving filter.

The processor may be configured to acquire information related to the illuminance around the electronic device by using light information collected from the third photodiode, and set the brightness of the display, based on the acquired information. The specified color component may be a green component.

The sensor region may include a third sensor region (e.g., the proximity sensor region 601 of FIG. 6A) for recognizing the proximity of an object with respect to the electronic device. The filter layer may further include a first light-emitting/light-receiving filter (e.g., the first light-emitting/light-receiving filter 650 of FIG. 6B) disposed in the third sensor region and configured to filter out a specified light component in a first wavelength band from incident light. The light-emitting/light-receiving layer may further include: a first light-emitting diode (e.g., the first light-emitting diode 635 of FIG. 6B) aligned with the first light-emitting/light-receiving filter in the third sensor region and configured to generate light in the first wavelength band; and a fourth photodiode (e.g., the fourth photodiode 645 of FIG. 6B) configured to respond to light having passed through the first light-emitting/light-receiving filter.

The filter layer may further include a second light-emitting/light-receiving filter (e.g., the second light-emitting/light-receiving filter 680 of FIG. 6C) disposed in the third sensor region and configured to filter out a specified light component in a second wavelength band from incident light. The light-emitting/light-receiving layer may further include: a second light-emitting diode (e.g., the second light-emitting diode 665 of FIG. 6C) aligned with the second light-emitting/light-receiving filter in the third sensor region and configured to generate light in the second wavelength band; and a fifth photodiode (e.g., the fifth photodiode 675 of FIG. 6C) configured to respond to light having passed through the second light-emitting/light-receiving filter. One of the first wavelength band and the second wavelength band may be a wavelength band corresponding to infrared light, and the other one may be a wavelength band corresponding to green light.

The sensor region may be placed on the outer edge of the display. The outer edge of the display may be divided into a display upper region, a display lower region, a display left region, and a display right region when facing the front surface, and the sensor region may be placed in at least one region of the display regions.

The processor may be configured to receive light information from the at least one photodiode while a light-emitting diode placed around the at least one photodiode does not emit light.

The processor may be configured to activate the at least one photodiode at a time when the display becomes dark before the screen to be displayed on the display is switched to an execution screen of a camera application, thereby receiving light information from the at least one photodiode.

The electronic device may further include a second camera disposed on the rear surface, and the processor may be configured to activate the at least one photodiode at a time when the display becomes dark before an image to be displayed on the display is switched from a second image acquired through the second camera to a first image acquired through the first camera, thereby receiving light information from the at least one photodiode.

The execution screen of the camera application to be displayed on the display may include: a first portion for interacting with a user; a second portion for displaying an image acquired through the first camera; and a third portion configured to be dark, and the sensor region may be placed in a display region corresponding to the third portion.

In accordance with an embodiment, the electronic device (e.g., the electronic device 300 of FIG. 3) may include: a front cover forming a front surface of the electronic device; a rear cover forming a rear surface opposite to the front surface; and a display placed between the front cover and the rear cover, visually exposed through the front cover, and divided into a display region and a sensor region for recognizing a light source, when facing the front surface. The display (e.g., the display 330 of FIG. 4B) may include: a light-emitting/light-receiving layer (e.g., the light-emitting/light-receiving layer 460 of FIG. 4B) including light-emitting diodes disposed in the display region, a first photodiode disposed in a first sub-sensor region of the sensor region, and a second photodiode disposed in a second sub-sensor region of the sensor region; and a filter layer (e.g., the filter layer 470 of FIG. 4B) placed between the front cover and the light-emitting/light-receiving layer and including light-emitting filters aligned with the light-emitting diodes in the display region, a first light-receiving filter aligned with the first photodiode in the first sub-sensor region, and a second light-receiving filter aligned with the second photodiode in the second sub-sensor region. The first light-receiving filter may filter out visible light and infrared light components from light received from the outside through the front cover. The second light-receiving filter may filter out a visible light component from light received from the outside through the front cover. The first photodiode may generate an electrical signal in response to the visible light and infrared light components having passed through the first light-receiving filter. The second photodiode may generate an electrical signal in response to the visible light component having passed through the second light-receiving filter.

The embodiments of the disclosure in the specification and drawings are merely provided for specific examples in order to easily explain the technical contents according to the embodiments of the disclosure and help comprehension of the embodiments of the disclosure, and do not limit the scope of the embodiments of the disclosure. Therefore, in addition to the embodiments disclosed herein, all changes or modifications derived from the technical ideas of various embodiments of the disclosure should be interpreted as being included in the scope of various embodiments of the disclosure.

While the disclosure has been described with reference to various embodiments, various changes may be made without departing from the spirit and the scope of the present disclosure, which is defined, not by the detailed description and embodiments, but by the appended claims and their equivalents.

What is claimed is:
1. An electronic device comprising:
   a front cover forming a front surface of the electronic device;
   a rear cover forming a rear surface opposite to the front surface;
   a display placed between the front cover and the rear cover and visually exposed through the front cover;
   a first camera disposed on the front surface; and
   a processor operatively connected to the first camera and the display,
   wherein the display is divided into a display region and a sensor region when facing the front surface, and comprises:
      a light-emitting/light-receiving layer comprising light-emitting diodes disposed in the display region, and at least one photodiode disposed in the sensor region; and
      a filter layer placed between the front cover and the light-emitting/light-receiving layer and comprising light-emitting filters aligned with the light-emitting diodes in the display region, and at least one light-receiving filter aligned with the at least one photodiode in the sensor region, and
   wherein the processor is configured to receive, from the at least one photodiode, light information related to light passed through the at least one light-receiving filter to be received by the at least one photodiode, and perform, by using the light information, a function related to an image acquired from the first camera to be displayed on the display.

2. The electronic device of claim 1, wherein the sensor region comprises a first sensor region configured to recognize a light source type, and
   wherein the at least one light-receiving filter comprises:
      a first light-receiving filter disposed in the first sensor region and configured to filter out visible light and infrared light components from light received from the outside through the front cover; and
      a second light-receiving filter disposed in the first sensor region and configured to filter out a visible light component from light received from the outside through the front cover, and
   wherein the at least one photodiode comprises:
      a first photodiode aligned with the first light-receiving filter in the first sensor region and configured to respond to light having passed through the first light-receiving filter; and
      a second photodiode aligned with the second light-receiving filter in the first sensor region and configured to respond to light having passed through the second light-receiving filter.

3. The electronic device of claim 2, wherein the processor is configured to:
   acquire information related to a light source type by using light information collected from the first photodiode and the second photodiode, and correct a first image acquired from the first camera, based on the acquired information, to display the corrected first image on the display.

4. The electronic device of claim 1, wherein the sensor region comprises a second sensor region for measuring the illuminance around the electronic device,
wherein the at least one light-receiving filter comprises a third light-receiving filter disposed in the second sensor region and configured to filter out a specified color component from light received from the outside through the front cover, and
wherein the at least one photodiode comprises a third photodiode aligned with the third light-receiving filter in the second sensor region and configured to respond to light having passed through the third light-receiving filter.

5. The electronic device of claim 4, wherein the processor is configured to acquire information related to the illuminance around the electronic device by using light information collected from the third photodiode, and
set the brightness of the display, based on the acquired information.

6. The electronic device of claim 4, wherein the specified color component is a green component.

7. The electronic device of claim 1, wherein the sensor region comprises a third sensor region for recognizing the proximity of an object with respect to the electronic device,
wherein the filter layer further comprises a first light-emitting/light-receiving filter disposed in the third sensor region and configured to filter out a specified light component in a first wavelength band from incident light, and
wherein the light-emitting/light-receiving layer further comprises: a first light-emitting diode aligned with the first light-emitting/light-receiving filter in the third sensor region and configured to generate light in the first wavelength band; and a fourth photodiode configured to respond to light having passed through the first light-emitting/light-receiving filter.

8. The electronic device of claim 7, wherein the filter layer further comprises a second light-emitting/light-receiving filter disposed in the third sensor region and configured to filter out a specified light component in a second wavelength band from incident light, and
wherein the light-emitting/light-receiving layer further comprises: a second light-emitting diode aligned with the second light-emitting/light-receiving filter in the third sensor region and configured to generate light in the second wavelength band; and a fifth photodiode configured to respond to light having passed through the second light-emitting/light-receiving filter.

9. The electronic device of claim 8, wherein one of the first wavelength band and the second wavelength band is a wavelength band corresponding to infrared light, and the other one is a wavelength band corresponding to green light.

10. The electronic device of claim 1, wherein the sensor region is placed on the outer edge of the display.

11. The electronic device of claim 10, wherein the outer edge of the display is divided into a display upper region, a display lower region, a display left region, and a display right region when facing the front surface, and
wherein the sensor region is placed in at least one region of the display regions.

12. The electronic device of claim 1, wherein the processor is configured to receive light information from the at least one photodiode while a light-emitting diode placed around the at least one photodiode does not emit light.

13. The electronic device of claim 12, wherein the processor is further configured to activate the at least one photodiode and receive light information from the activated at least one photodiode, when the display becomes dark before a screen to be displayed on the display is switched to an execution screen of a camera application.

14. The electronic device of claim 12, further comprising a second camera disposed on the rear surface,
wherein the processor is configured to activate the at least one photodiode at a time and receive light information from the at least one photodiode, when the display becomes dark before an image to be displayed on the display is switched from a second image acquired through the second camera to a first image acquired through the first camera.

15. The electronic device of claim 1, wherein the execution screen of the camera application to be displayed on the display comprises:
a first portion configured to interact with a user;
a second portion configured to display an image acquired through the first camera; and
a third portion configured to be dark, and
wherein the sensor region is placed in a display region corresponding to the third portion.

16. An electronic device comprising:
a front cover forming a front surface of the electronic device;
a rear cover forming a rear surface opposite to the front surface; and
a display placed between the front cover and the rear cover, visually exposed through the front cover, and divided into a display region and a sensor region for recognizing a light source, when facing the front surface,
wherein the display comprises:
a light-emitting/light-receiving layer comprising light-emitting diodes disposed in the display region, a first photodiode disposed in a first sub-sensor region of the sensor region, and a second photodiode disposed in a second sub-sensor region of the sensor region; and
a filter layer placed between the front cover and the light-emitting/light-receiving layer and comprising light-emitting filters aligned with the light-emitting diodes in the display region, a first light-receiving filter aligned with the first photodiode in the first sub-sensor region, and a second light-receiving filter aligned with the second photodiode in the second sub-sensor region,
wherein the first light-receiving filter is configured to filter out visible light and infrared light components from light received from the outside through the front cover,
wherein the second light-receiving filter is configured to filter out a visible light component from light received from the outside through the front cover,
wherein the first photodiode configured to generate an electrical signal in response to visible light and infrared light components having passed through the first light-receiving filter, and
wherein the second photodiode is configured to generate an electrical signal in response to a visible light component having passed through the second light-receiving filter.

* * * * *